US008158568B2

(12) United States Patent
Yokoi et al.

(10) Patent No.: US 8,158,568 B2
(45) Date of Patent: Apr. 17, 2012

(54) CLEANING LIQUID USED IN PROCESS FOR FORMING DUAL DAMASCENE STRUCTURE AND A PROCESS FOR TREATING SUBSTRATE THEREWITH

(75) Inventors: Shigeru Yokoi, Kanagawa-ken (JP); Kazumasa Wakiya, Kanagawa-ken (JP)

(73) Assignee: Tokyo Ohka Kogyo Co., Ltd., Kanagawa-Ken (JP)

( * ) Notice: Subject to any disclaimer, the term of this patent is extended or adjusted under 35 U.S.C. 154(b) by 0 days.

(21) Appl. No.: 12/801,452

(22) Filed: Jun. 9, 2010

(65) Prior Publication Data

US 2010/0248477 A1 Sep. 30, 2010

Related U.S. Application Data

(63) Continuation of application No. 12/591,210, filed on Nov. 12, 2009, now abandoned, which is a continuation of application No. 12/379,099, filed on Feb. 12, 2009, now abandoned, which is a continuation of application No. 11/473,030, filed on Jun. 23, 2006, now abandoned, which is a continuation of application No. 10/657,177, filed on Sep. 9, 2003, now abandoned.

(30) Foreign Application Priority Data

Sep. 9, 2002 (JP) .................. 2002-262565

(51) Int. Cl.
*C11D 3/34* (2006.01)
*C11D 3/44* (2006.01)
*C11D 1/62* (2006.01)

(52) U.S. Cl. ........ 510/175; 510/176; 510/178; 510/181; 510/182; 510/504; 134/1.2; 134/1.3

(58) Field of Classification Search .................. 510/175, 510/176, 178, 181, 182, 504; 134/1.2, 1.3
See application file for complete search history.

(56) References Cited

U.S. PATENT DOCUMENTS

| | | | |
|---|---|---|---|
| 4,788,039 A * | 11/1988 | Glattstein ............... 422/430 |
| 5,795,702 A | 8/1998 | Tanabe et al. |
| 5,905,063 A | 5/1999 | Tanabe et al. |
| 5,911,836 A | 6/1999 | Hara et al. |
| 5,988,186 A | 11/1999 | Ward et al. |
| 6,040,117 A * | 3/2000 | Ota et al. ............... 430/311 |
| 6,268,323 B1 | 7/2001 | Honda et al. |
| 6,329,118 B1 | 12/2001 | Hussein et al. |
| 6,365,529 B1 | 4/2002 | Hussein et al. |
| 6,410,437 B1 | 6/2002 | Flanner et al. |
| 6,417,112 B1 * | 7/2002 | Peyne et al. ............ 438/754 |
| 6,465,403 B1 * | 10/2002 | Skee ..................... 510/175 |
| 6,531,436 B1 | 3/2003 | Sahbari et al. |
| 6,638,899 B1 | 10/2003 | Wakiya et al. |
| 6,797,682 B2 * | 9/2004 | Hara et al. ............. 510/175 |
| 6,974,766 B1 | 12/2005 | Huang |
| 7,470,611 B2 | 12/2008 | Huang |
| 2001/0014534 A1 | 8/2001 | Aoki et al. |
| 2001/0021489 A1 | 9/2001 | Wakiya et al. |
| 2001/0025017 A1 | 9/2001 | Amemiya et al. |
| 2003/0114014 A1 | 6/2003 | Yokoi et al. |
| 2003/0138737 A1 * | 7/2003 | Wakiya et al. ......... 430/331 |
| 2004/0220065 A1 * | 11/2004 | Hsu ...................... 510/175 |
| 2006/0089007 A1 | 4/2006 | Huang |
| 2007/0037087 A1 * | 2/2007 | Yokoi et al. ........... 430/256 |

FOREIGN PATENT DOCUMENTS

| | | |
|---|---|---|
| CN | 1402090 A | 3/2003 |
| CN | 1428659 A | 7/2003 |
| JP | 7-247498 | 9/1995 |
| JP | 8-301911 | 11/1996 |
| JP | 2000-031118 | 1/2000 |
| JP | 2001-188363 | 7/2001 |
| JP | 2001-209191 | 8/2001 |
| JP | 2001-324823 | 11/2001 |
| JP | 2002-526916 | 8/2002 |
| KR | 2001-30323 | 4/2001 |
| KR | 2001-72673 | 7/2001 |
| WO | 0203454 A | 1/2002 |

\* cited by examiner

*Primary Examiner* — Charles Boyer
(74) *Attorney, Agent, or Firm* — Wenderoth, Lind & Ponack, L.L.P.

(57) ABSTRACT

It is disclosed a cleaning liquid used in a process for forming a dual damascene structure comprising steps of etching a low dielectric layer (low-k layer) accumulated on a substrate having thereon a metallic layer to form a first etched-space; charging a sacrifice layer in the first etched-space; partially etching the low dielectric layer and the sacrifice layer to form a second etched-space connected to the first etched-space; and removing the sacrifice layer remaining in the first etched-space with the cleaning liquid, wherein the cleaning liquid comprises (a) 1-25 mass % of a quaternary ammonium hydroxide, such as TMAH and choline (b) 30-70 mass % of a water soluble organic solvent, and (c) 20-60 mass % of water. The cleaning liquid attains in a well balanced manner such effects that a sacrifice layer used for forming a dual damascene structure is excellently removed, and a low dielectric layer is not damaged upon formation of a metallic wiring on a substrate having a metallic layer (such as a Cu layer) and the low dielectric layer formed thereon.

9 Claims, No Drawings

CLEANING LIQUID USED IN PROCESS FOR FORMING DUAL DAMASCENE STRUCTURE AND A PROCESS FOR TREATING SUBSTRATE THEREWITH

This application is a continuation of Ser. No. 12/591,210, filed Nov. 12, 2009, now abandoned, which is a continuation of Ser. No. 12/379,099, filed Feb. 12, 2009, now abandoned, which is a continuation of Ser. No. 11/473,030, filed Jun. 23, 2006, now abandoned which is a continuation of U.S. Ser. No. 10/657,177, filed Sep. 9, 2003, now abandoned.

BACKGROUND OF THE INVENTION

1. Field of the Invention

The present invention relates to a cleaning liquid used in a process for forming a dual damascene structure and a method for treating a substrate therewith. The cleaning liquid of the invention is favorably used in production of a semiconductor device, such as IC and LSI.

2. Description of the Related Art

A semiconductor device, such as IC and LSI, is produced in the following process. A photoresist is uniformly coated on an electroconductive metallic film, an insulating film or a low dielectric material film formed on a substrate, such as a silicon wafer, by CVD vapor deposition process or the like. The photoresist is selectively subjected to exposure and development to form a photoresist pattern. The electroconductive metallic film, the insulating film or the low dielectric material film formed by CVD vapor deposition is selectively etched by using the photoresist pattern as a mask to form a minute circuit, and the photoresist layer thus becoming unnecessary is then removed with a remover liquid.

It is a trend in recent years that wiring circuits are becoming minute and multilayered as integration degree of semiconductor devices increases and chip size reduces, in which there arise problems in semiconductor devices, i.e., resistance of metallic films (wiring resistance) and wiring delay caused by wiring capacities. Accordingly, there are proposals of using metals, such as copper (Cu), having resistance smaller than that of aluminum (Al) having been mainly employed as a wiring material, and in recent years, two kinds of devices are being used, i.e., devices using an Al wiring (a metallic wiring using Al as a major component, such as Al and an Al alloy) and devices using a copper wiring (a metallic wiring using Cu as a major component).

Upon forming a Cu metallic wiring, in particular, a process is used in which a Cu multilayer wiring is formed without etching Cu by using a dual damascene process, owing to the low etching resistance of Cu. Various kinds of dual damascene processes have been proposed, an example of which will be described below, but the dual damascene process is not limited thereto.

After forming a Cu layer on a substrate, an interlayer film, such as a low dielectric film and an insulating film, is accumulated as being multilayered thereon, and a photoresist pattern is formed on the uppermost layer by a photolithography technique. The photoresist pattern serves as a mask pattern for forming via holes, in which openings are formed on regions where via holes are to be formed. Thereafter, the multilayer structure having the low dielectric film, the insulating film and the like is etched by using the photoresist pattern as a mask to form via holes reaching the Cu layer. The photoresist pattern is removed, and a sacrifice layer containing an alkoxysilane material or the like is charged in the via holes.

Subsequently, another photoresist pattern (mask pattern) for forming a trench pattern is formed on the uppermost layer on the remaining multilayer structure, and the low dielectric film, the insulating film and the sacrifice layer are partially etched to a prescribed depth with the pattern as a mask, whereby trenches for wiring reaching the via holes are formed. The sacrifice layer remaining in the via holes is then removed and cleaned. After removing the photoresist pattern, Cu is charged in the via holes and the trenches by plating process or the like, so as to form a multilayer Cu wiring.

In the formation process by the dual damascene process, it is necessary that not only the sacrifice layer is completely removed and cleaned, but also damages on the low dielectric layer having openings exposed to the dual damascene structure are suppressed.

Upon removal of the sacrifice layer in the dual damascene process, a buffered hydrofluoric acid and the like have been used as a remover liquid (as shown, for example, U.S. Pat. No. 6,365,529 (column 8, lines 2 to 6) and U.S. Pat. No. 6,329,118 (column 7, lines 57 to 61)), but in the case where the remover liquid is used, there is such a problem that damages on the low dielectric layer cannot be sufficiently suppressed.

The following remover liquids are proposed as a quaternary ammonium remover liquid in the photolithography field, i.e., a remover liquid containing a mixture of a quaternary ammonium salt, dimethyl sulfoxide and water (in particular, a dimethyl sulfoxide solution (containing 1.5 mass % of water) containing 0.5 mass % of tetramethylammonium hydroxide) (as described in JP-A-8-301911 (paragraphs 0032 and 0043), a stripping composition containing a polar aprotic solvent, such as dimethyl sulfoxide and sulfolane, and an aggressive base, such as a quaternary ammonium hydroxide, (as described in JP-A-2001-324823), and a remover liquid containing dimethyl sulfoxide, an alcohol amine, water and quaternary ammonium hydroxide (as described in JP-A-7-28254). However, these are used for removing an organic film, such as a photoresist, but there is no disclosure on removal of a sacrifice layer and no suggestion on suppression of damages on a low dielectric layer, in the dual damascene process.

SUMMARY OF THE INVENTION

An object of the invention is to provide a cleaning liquid attaining in a well balanced manner such effects that a sacrifice layer used for forming a dual damascene structure is excellently removed, and a low dielectric layer is not damaged upon formation of a metallic wiring on a substrate having a metallic layer (such as a Cu layer) and the low dielectric layer formed thereon.

The invention relates to, as one aspect, a cleaning liquid used in a process for forming a dual damascene structure comprising steps of etching a low dielectric layer accumulated on a substrate having thereon a metallic layer to form a first etched-space; charging a sacrifice layer in the first etched-space; partially etching the low dielectric layer and the sacrifice layer to form a second etched-space connected to the first etched-space; and removing the sacrifice layer remaining in the first etched-space with the cleaning liquid, wherein the cleaning liquid comprises (a) 1-25 mass % of a quaternary ammonium hydroxide represented by the following general formula (I), (b) 30-70 mass % of a water soluble organic solvent, and (c) 20-60 mass % of water:

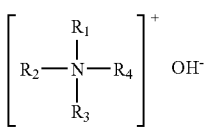

wherein $R_1$, $R_2$, $R_3$ and $R_4$ each independently represents an alkyl group having 1-4 carbon atoms or a hydroxyalkyl group having 1-4 carbon atoms.

The invention also relates to, as another aspect, a process for treating a substrate having a dual damascene structure comprising steps of: etching a low dielectric layer accumulated on a substrate having thereon a metallic layer to form a first etched-space; charging a sacrifice layer in the first etched-space; partially etching the low dielectric layer and the sacrifice layer to form a second etched-space connected to the first etched-space; and bringing the sacrifice layer remaining in the first etched-space in contact with the aforementioned cleaning liquid to remove the sacrifice layer.

DETAILED DESCRIPTION OF THE INVENTION

The cleaning liquid of the invention is used for removing a sacrifice layer in a process for forming a dual damascene structure on a substrate having thereon a metallic layer and a low dielectric layer, and component (a) is a quaternary ammonium hydroxide represented by the following general formula (I):

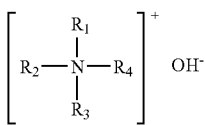

wherein $R_1$, $R_2$, $R_3$ and $R_4$ each independently represents an alkyl group having 1-4 carbon atoms or a hydroxyalkyl group having 1-4 carbon atoms.

Specific examples thereof include tetramethylammonium hydroxide (TMAH), tetraethylammonium hydroxide, tetrapropylammonium hydroxide, tetrabutylammonium hydroxide, mono-methyltripropylammonium hydroxide, trimethylethylammonium hydroxide, (2-hydroxyethyl)trimethylammonium hydroxide [=choline], (2-hydroxyethyl)triethylammonium hydroxide, (2-hydroxyethyl)tripropylammonium hydroxide, and (1-hydroxypropyl)trimethylammonium hydroxide. Among these, TMAH and choline are preferred, and TMAH are most preferred, owing to the high dissolving capability to a sacrifice layer. Component (a) may be used singly or as a combination of two or more kinds thereof.

The amount of component (a) in the cleaning liquid of the invention is 1-25 mass %, and preferably 8-12 mass %. In the case where the amount of component (a) is less than 1 mass %, the dissolving capability to the sacrifice layer is low to fail to attain sufficient removal thereof, and in the case where it exceeds 25 mass %, the low dielectric layer is damaged.

The water soluble organic solvent as component (b) may be any organic solvent that is miscible with water and the other components, and those having been conventionally used in this field of art may be used. Specific examples thereof include a sulfoxide, such as dimethyl sulfoxide; a sulfone, such as dimethyl sulfone, diethyl sulfone, bis(2-hydroxyethyl)sulfone and tetramethyl sulfone; an amide, such as N,N-dimethylformamide, N-methylformamide, N,N-dimethylacetamide, N-methylacetamide and N,N-diethylacetamide; a lactam, such as N-methyl-2-pyrrolidone, N-ethyl-2-pyrrolidone, N-propyl-2-pyrrolidone, N-hydroxymethyl-2-pyrrolidone and N-hydroxyethyl-2-pyrrolidone; an imidazolidinone, such as 1,3-dimethyl-2-imidazolidinone, 1,3-diethyl-2-imidazolidinone and 1,3-diisopropyl-2-imidazolidinone; and a polyhydric alcohol and a derivative thereof, such as ethylene glycol, ethylene glycol monomethyl ether, ethylene glycol monoethyl ether, ethylene glycol monobutyl ether, ethylene glycol monomethyl ether acetate, ethylene glycol monoethyl ether acetate, diethylene glycol, diethylene glycol monomethyl ether, diethylene glycol monoethyl ether, diethylene glycol monobutyl ether, propylene glycol monomethyl ether, propylene glycol monoethyl ether, propylene glycol monopropyl ether and propylene glycol monobutyl ether. Among these, dimethyl sulfoxide and N-methyl-2-pyrrolidone are preferably used. Component (b) may be used singly or as a combination of two or more kinds thereof.

The amount of component (b) in the cleaning liquid of the invention is 30-70 mass %, and preferably 40-60 mass %. In the case where the amount of component (b) is less than 30 mass %, the low dielectric layer is damaged, and in the case where it exceeds 70 mass %, the dissolving capability to the sacrifice layer is low to fail to attain sufficient removal thereof.

The amount of water as component (c) in the cleaning liquid of the invention is 20-60 mass %, and preferably 30-50 mass %. In the case where the amount of component (c) is less than 20 mass %, the dissolving capability to the sacrifice layer is low to fail to attain sufficient removal thereof, and in the case where it exceeds 60 mass %, the low dielectric layer is damaged.

In addition to components (a) to (c), the cleaning liquid of the invention may further contain (d) mercapto group-containing compound, and/or (e) a quaternary ammonium hydroxide represented by the following general formula (II), with the proviso that component (e) differs from component (a):

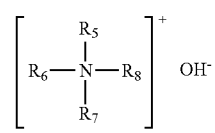

wherein $R_5$, $R_6$, $R_7$ and $R_8$ each independently represents an alkyl group having 1-20 carbon atoms or a hydroxyalkyl group having 1-20 carbon atoms, provided that at least one of $R_5$, $R_6$, $R_7$ and $R_8$ represents an alkyl group having 10 or more carbon atoms, or at least two of $R_5$, $R_6$, $R_7$ and $R_8$ each independently represents a hydroxyalkyl group having 2-5 carbon atoms.

As component (d), a compound is preferred which has a structure that has a hydroxyl group and/or a carboxyl group on at least one of an α-position and a β-position of a carbon atom connected to a mercapto group. Specific preferred examples of the compound include 1-thioglycerol, 3-(2-aminophenylthio)-2-hydroxypropylmercaptan, 3-(2-hydroxyethylthio)-2-hydroxypropylmercaptan, 2-mercaptopropionic acid and 3-mercaptopropionic acid. Among these, 1-thioglycerol is particularly preferably used. Component (d) may be used singly or as a combination of two or more kinds thereof.

In the incorporation of component (d), the amount thereof in the cleaning liquid of the invention is preferably 0.01-15 mass %, and particularly 0.1-10 mass %. Corrosion of Cu can be further effectively prevented by the incorporation of component (d).

Specific preferred examples of component (e) include hexadecyltrimethylammonium hydroxide, tri(2-hydroxyethyl)methylammonium hydroxide and tetra(2-hydroxyethyl)ammonium hydroxide. Component (e) may be used singly or as a combination of two or more kinds thereof.

In the incorporation of component (e), the amount thereof in the cleaning liquid of the invention is preferably 0.01-15 mass %, and particularly 0.1-10 mass %. Corrosion of Cu can be further effectively prevented by the incorporation of component (e).

Examples of a specific embodiment of the use of the cleaning liquid according to the invention and a specific embodiment of a process for treating a substrate using the cleaning liquid according to the invention will be described below. However, the invention is not limited to the examples.

As the dual damascene process used in the invention, processes having been known in this field of art may be employed, which include the via first process, in which via holes are firstly formed, and then trenches (trenches for wiring) are formed, and the trench first process, in which trenches are firstly formed, and then via holes are formed.

Specifically, for example, a metallic layer (an electroconductive layer) is provided on a substrate, a barrier layer (an etching stopper layer) is then provided thereon. A low dielectric layer is accumulated on the barrier layer, and a photoresist layer is provided on the low dielectric layer. The photoresist layer is then selectively exposed and developed to form a photoresist pattern.

Subsequently, in the via first process, the low dielectric layer is etched by using the photoresist pattern as a mask to form via holes (i.e., the first etched-space) connected to the metallic layer on the substrate, and the photoresist pattern is then removed by ashing treatment or the like. A sacrifice layer is then charged in the via holes. Thereafter, another photoresist pattern is formed on the remaining low dielectric layer, and the low dielectric layer and the sacrifice layer are etched to a prescribed depth by using the photoresist pattern as a mask to form trenches (i.e., the second etched-space) connected to the via holes.

In the trench first process, on the other hand, the low dielectric layer is etched to a prescribed thickness by using the photoresist pattern as a mask to form trenches (i.e., the first etched-space), and the photoresist pattern is then removed by ashing treatment or the like. A sacrifice layer is then charged in the trenches. Thereafter, another photoresist pattern is formed on the remaining low dielectric layer, and the low dielectric layer and the sacrifice layer are etched to connect to the trench by using the photoresist pattern as a mask to form via holes (i.e., the second etched-space), lower parts of which are connected to the Cu layer on the substrate.

After completing one of the foregoing processes, the sacrifice layer charged in the via holes in the via first process, or the sacrifice layer charged in the trenches in the trench first process is made in contact with the cleaning liquid according to the invention to remove the sacrifice layer. A metal is charged in the via holes and the trenches of the substrate thus processed to produce a multilayer metallic wiring substrate.

Examples of the material for the metallic layer include Cu, a Cu alloy, Al and an Al alloy. The metallic layer may be formed by the CVD vapor deposition process, the electrolytic plating or the like, but is not limited thereto.

Examples of the material for the barrier (etching stopper) layer include SiN, SiCN, Ta and TaN.

Examples of the material for the low dielectric layer include a low dielectric material (low-k material), for example, a carbon-doped silicon oxide (SiOC) material, such as "Black Diamond" (produced by Applied Materials, Inc.), "Coral" (produced by Novellus Systems, Inc.) and "Aurora" (produced by ASM Japan Co., Ltd.); an MSQ (methylsilsesquioxane) material, such as "OCD T-7", "OCD T-9", "OCD T-11", "OCD T-31" and "OCD T-39" (all produced by Tokyo Ohka Kogyo Co., Ltd.); and an HSQ (hydroxysilsesquioxane) material, such as "OCD T-12" and "OCD T-32" (all produced by Tokyo Ohka Kogyo Co., Ltd.), but it is not limited to these examples.

The low dielectric layer may be formed directly on the metallic layer. The formation of the low dielectric layer can be carried out by coating the low dielectric material (low-k material) as exemplified above and baked, in general, at a high temperature of 350° C. or higher to attain crystallization.

Preferred examples of the photoresist include photoresist materials having been generally used for a KrF, ArF or $F_2$ excimer laser or an electron beam. The photoresist pattern may be formed by the ordinary photolithography technique.

The etching of the low dielectric layer may be carried out by the ordinary process, such as dry etching. The ashing of the photoresist pattern may also be carried out by the ordinary process. In the case where the low dielectric layer has a low dielectric constant (k) of about 3 or less, the ashing is not carried out due to the low ashing resistance thereof, but the photoresist pattern can be removed with a known resist remover liquid or the like.

Subsequently, the sacrifice layer is charged in the first etched-space (i.e., the via holes or the trenches) thus formed. As the material for the sacrifice layer, for example, a spin-on-glass material or a material obtained by adding a light absorbing substance thereto is employed.

Examples of the spin-on-glass material include a material obtained by hydrolyzing at least one compound selected from the following compounds (i) to (iii) in the presence of an acid catalyst, but it is not limited thereto.

The compound (i) is represented by the following general formula (III):

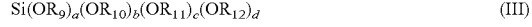
$$Si(OR_9)_a(OR_{10})_b(OR_{11})_c(OR_{12})_d \qquad (III)$$

wherein $R_9$, $R_{10}$, $R_{11}$ and $R_{12}$ each independently represents an alkyl group having 1-4 carbon atoms or a phenyl group; and a, b, c and d each independently represents an integer of 0-4, provided that a, b, c and d satisfy a condition of a+b+c+d=4.

The compound (ii) is represented by the following general formula (IV):

$$R_{13}Si(OR_{14})_e(OR_{15})_f(OR_{16})_g \qquad (IV)$$

wherein $R_{13}$ represents a hydrogen atom, an alkyl group having 1-4 carbon atoms or a phenyl group; $R_{14}$, $R_{15}$ and $R_{16}$ each independently represents an alkyl group having 1-4 carbon atoms or a phenyl group; and e, f and g each independently represents an integer of 0-3, provided that e, f and g satisfy a condition of e+f+g=3.

The compound (iii) is represented by the following general formula (V):

$$R_{17}R_{18}Si(OR_{19})_h(OR_{20})_i \qquad (V)$$

wherein $R_{17}$ and $R_{18}$ each independently represents a hydrogen atom, an alkyl group having 1-4 carbon atoms or a phenyl group; $R_{19}$ and $R_{20}$ each independently represents an alkyl group having 1-4 carbon atoms or a phenyl group; and h and i each independently represents an integer of 0-2, provided that h and i satisfy a condition of h+i=2.

Examples of the compound (i) include tetramethoxysilane, tetraethoxysilane, tetrapropoxysilane, tetrabutoxysilane, tetraphenoxysilane, trimethoxymonoethoxysilane, dimethoxydiethoxysilane, triethoxymonomethoxysilane, trimethoxymonopropoxysilane, monomethoxytributoxysilane, monomethoxytriphenoxysilane, dimethoxydipropoxysilane, tripropoxymonomethoxysilane, trimethoxymonobutoxysilane, dimethoxydibutoxysilane, triethoxymonopropoxysilane, diethoxydipropoxysilane, tributoxymonopropoxysilane, dimethoxymonoethoxymonobutoxysilane, diethoxymonomethoxymonobutoxysilane, diethoxymonopropoxymonobutoxysilane, dipropoxymonomethoxymonoethoxysilane, dipropoxymonomethoxymonobutoxysilane, dipropoxymonoethoxymonobutoxysilane, dibutoxymonomethoxymonoethoxysilane, dibutoxymonoethoxymonopropoxysilane and monomethoxymonoethoxymonopropoxymonobutoxysilane.

Examples of the compound (ii) include trimethoxysilane, triethoxysilane, tripropoxysilane, triphenoxysilane, dimethoxymonoethoxysilane, diethoxymonomethoxysilane, dipropoxymonomethoxysilane, dipropoxymonoethoxysilane, diphenoxymonomethoxysilane, diphenoxymonoethoxysilane, diphenoxymonopropoxysilane, methoxyethoxypropoxysilane, monopropoxydimethoxysilane, monopropoxydiethoxysilane, monobutoxydimethoxysilane, monophenoxydiethoxysilane, methyltrimethoxysilane, methyltriethoxysilane, methyltripropoxysilane, ethyltrimethoxysilane, ethyltripropoxysilane, ethyltriphenoxysilane, propyltrimethoxysilane, propyltriethoxysilane, propyltriphenoxysilane, butyltrimethoxysilane, butyltriethoxysilane, butyltripropoxysilane, butyltriphenoxysilane, methylmonomethoxydiethoxysilane, ethylmonomethoxydiethoxysilane, propylmonomethoxydiethoxysilane, butylmonomethoxydiethoxysilane, methylmonomethoxydipropoxysilane, methylmonomethoxydiphenoxysilane, ethylmonomethoxydipropoxysilane, ethylmonomethoxydiphenoxysilane, propylmonomethoxydipropoxysilane, propylmonomethoxydiphenoxysilane, butylmonomethoxydipropoxysilane, butylmonomethoxydiphenoxysilane, methylmethoxyethoxypropoxysilane, propylmethoxyethoxypropoxysilane, butylmethoxyethoxypropoxysilane, methylmonomethoxymonoethoxymonobutoxysilane, ethylmonomethoxymonoethoxymonobutoxysilane, propylmonomethoxymonoethoxymonobutoxysilane and butylmonomethoxymonoethoxymonobutoxysilane.

Examples of the compound (iii) include dimethoxysilane, diethoxysilane, dipropoxysilane, diphenoxysilane, methoxyethoxysilane, methoxypropoxysilane, methoxyphenoxysilane, ethoxypropoxysilane, ethoxyphenoxysilane, methyldimethoxysilane, methylmethoxyethoxysilane, methyldiethoxysilane, methylmethoxypropoxysilane, methylmethoxyphenoxysilane, ethyldipropoxysilane, ethylmethoxypropoxysilane, ethyldiphenoxysilane, propyldimethoxysilane, propylmethoxyethoxysilane, propylethoxypropoxysilane, propyldiethoxysilane, propyldiphenoxysilane, butyldimethoxysilane, butylmethoxyethoxysilane, butyldiethoxysilane, butylethoxypropoxysilane, butyldipropoxysilane, butylmethylphenoxysilane, dimethyldimethoxysilane, dimethylmethoxyethoxysilane, dimethyldiethoxysilane, dimethyldiphenoxysilane, dimethylethoxypropoxysilane, dimethyldipropoxysilane, diethylmethoxysilane, diethylmethoxypropoxysilane, diethyldiethoxysilane, diethylethoxypropoxysilane, dipropyldimethoxysilane, dipropyldiethoxysilane, dipropyldiphenoxysilane, dibutyldimethoxysilane, dibutyldiethoxysilane, dibutyldipropoxysilane, dibutylmethoxyphenoxysilane, methylethyldimethoxysilane, methylethyldiethoxysilane, methylethyldipropoxysilane, methylethyldiphenoxysilane, methylpropyldimethoxysilane, methylpropyldiethoxysilane, methylbutyldimethyoxysilane, methylbutyldiethoxysilane, methylbutyldipropoxysilane, methylethylethoxypropoxysilane, ethylpropyldimethoxysilane, ethylpropylmethoxyethoxysilane, dipropyldimethoxysilane, dipropylmethoxyethoxysilane, propylbutyldimethoxysilane, propylbutyldiethoxysilane, dibutylmethoxyethoxysilane, dibutylmethoxypropoxysilane and dibutylethoxypropoxysilane.

Preferred examples of the light absorbing substance that can be added to the spin-on-glass material include at least one kind of a compound having, in the structure thereof, a substituent capable of being condensed with the compounds (i) to (iii). Examples of the light absorbing substance include a sulfone compound, a benzophenone compound, an anthracene compound and a naphthalene compound. In particular, a bisphenylsulfone compound and a benzophenone compound having at least two hydroxyl groups, an anthracene compound having at least one substituent selected from a hydroxyl group, a hydroxyalkyl group and a carboxyl group, and a naphthalene compound having at least one substituent selected from a hydroxyl group and a carboxyl group are preferred.

Examples of the bisphenylsulfone compound having at least two hydroxyl groups include a bis(hydroxyphenyl)sulfone compound and a bis(polyhydroxyphenyl)sulfone compound. Specific examples thereof include bis(4-hydroxyphenyl)sulfone, bis(3,5-dimethyl-4-hydroxyphenyl)sulfone, bis(2,3-dihydroxyphenyl)sulfone, bis(2,4-dihydroxyphenyl)sulfone, bis(2,4-dihydroxy-6-methylphenyl)sulfone, bis(5-chloro-2,4-dihydroxyphenyl)sulfone, bis(2,5-dihydroxyphenyl)sulfone, bis(3,4-dihydroxyphenyl)sulfone, bis(3,5-dihydroxyphenyl)sulfone, bis(2,3,4-trihydroxyphenyl)sulfone, bis(2,3,4-trihydroxy-6-methylphenyl)sulfone, bis(5-chloro-2,3,4-trihydroxyphenyl)sulfone, bis(2,4,6-trihydroxyphenyl)sulfone and bis(5-chloro-2,3-dihydroxyphenyl)sulfone.

Examples of the benzophenone compound having at least two hydroxyl groups include 2,4-dihydroxybenzophenone, 2,3,4-trihydroxybenzophenone, 2,2',4,4"-tetrahydroxybenzophenone, 2,2',5,6'-tetrahydroxybenzophenone, 2,2'-dihydroxy-4-methoxybenzophenone, 2,6-dihydroxy-4-methoxybenzophenone, 2,2'-dihydroxy-4,4'-dimethoxybenzophenone, 4-dimethylamino-2',4'-dihydroxybenzophenone and 4-dimethylamino-3'4'-dihydroxybenzophenone.

Examples of the anthracene compound having at least one substituent selected from a hydroxyl group, a hydroxyalkyl group and a carboxyl group include a compound represented by the following general formula (VI):

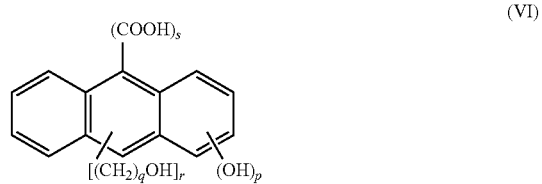

wherein p represents an integer of 0-8; q represents an integer of 0-10; r represents an integer of 0-6; and s represents 0 or 1, provided that p, q and r are not simultaneously 0.

Specific examples of the compound include 1-hydroxyanthracene, 9-hydroxyanthracene, anthracene-9-carboxylic acid, 1,2-dihydroxyanthracene, 1,2-dihydroxy-9-carboxyanthracene, 1,5-dihydroxyanthracene, 1,5-dihydroxy-9-carboxyanthracene, 9,10-dihydroxyanthracene, 1,2,3-trihydroxyanthracene, 1,2,3,4-tetrahydroxyanthracene, 1,2,3,4,5,6-hexahydroxyanthracene, 1,2,3,4,5,6,7,8-octahydroxyanthracene, 1-hydroxymethylanthracene, 9-hydroxymethylanthracene, 9-hydroxyethylanthracene, 9-hydroxyhexylanthracene, 9-hydroxyoctylanthracene and 9,10-dihydroxymethylanthracene.

Specific examples of the naphthalene compound having at least one substituent selected from a hydroxyl group and a carboxyl group include 1-naphthol, 2-naphthol, 1-naphthalene ethanol, 2-naphthalene ethanol, 1,3-naphthalenediol, naphthalene-1-carboxylic acid, naphthalene-2-carboxylic acid, naphthalene-1,4-dicarboxylic acid, naphthalene-2,3-dicarboxylic acid, naphthalene-2,6-dicarboxylic acid, naphthalene-2,7-dicarboxylic acid and naphthalene-1-acetic acid.

The spin-on-glass material is charged in the first etched-space (i.e., the via holes or the trenches) and then baked at a relatively low temperature of 250° C. or lower to form the sacrifice layer.

The spin-on-glass material as the material for the sacrifice layer preferably has an etching rate equivalent to that of the material used in the low dielectric layer, and a material of the same kind as the low dielectric layer may be used therefor. However, while the low dielectric layer is formed through crystallization by baking at a high temperature, the sacrifice layer is formed by baking at a relatively lower temperature than the crystallization temperature since it is finally removed after etching.

Subsequently, another resist pattern is formed on the low dielectric layer, and the second etched-space (i.e., the trenches or the via holes) is formed by using the photoresist pattern as a mask according to an ordinary process. Consequently, a dual damascene structure is formed, which is an interconnection structure connected to the metallic layer on the substrate.

It is necessary herein that the sacrifice layer remaining in the first etched-space is removed. The sacrifice layer can be completely removed by bringing it in contact with the cleaning liquid according to the invention without damaging the part of the low dielectric layer that is exposed to the etched-space.

The contact to the cleaning liquid may be carried out by an ordinary method, such as a dipping method, a paddle method and a shower method. The contact time may be a period of time sufficient to remove the sacrifice layer and can be appropriately adjusted depending on the contact method. The contact is generally carried out at a temperature of 20-80° C. for 1-40 minutes, but the invention is not limited thereto.

The photoresist pattern on the low dielectric layer is then removed by ashing treatment or the like. As described in the foregoing, in the case where the low dielectric layer has a low dielectric constant (k) of about 3 or less, the ashing is not carried out due to the low ashing resistance thereof, but the photoresist pattern can be removed with a known resist remover liquid or the like.

The cleaning liquid of the invention exhibits a large difference between the solubility to the low dielectric layer (low-k layer) and the solubility to the sacrifice layer, and therefore, it readily provides a good selectivity. Furthermore, damages on the low dielectric layer (low-k layer) can be considerably decreased in comparison to the case using a diluted hydrofluoric acid solution, which has been often used as a remover for a sacrifice layer.

EXAMPLE

The invention will be described in detail below with reference to the example, but the invention is not construed as being limited thereto. All the amounts in the example are in terms of percent by mass unless otherwise indicated.

Examples 1-5 and Comparative Examples 1-5

A barrier layer formed with an SiN film as the first layer, a low dielectric layer (formed with "OCD T-12", produced by Tokyo Ohka Kogyo Co., Ltd.) as the second layer, a barrier layer formed with an SiN film as the third layer, and a low dielectric layer (formed with "OCD T-12", produced by Tokyo Ohka Kogyo Co., Ltd.) as the fourth layer were formed on a substrate having a Cu layer formed thereon. A photoresist pattern is formed thereon by the photolithography technique, and via holes connected to the Cu layer were formed by etching the first to fourth layers with the photoresist patter as a mask. A sacrifice layer (formed with "OCD T-32", produced by Tokyo Ohka Kogyo Co., Ltd.) was charged in the via holes (baked at 200° C.). Another photoresist pattern is formed thereon by the photolithography technique, and trenches were formed by etching with the photoresist pattern as a mask.

The substrate thus obtained was subjected to a dipping treatment in the cleaning liquids shown in Table 1 below (at 40° C. for 20 minutes) and then rinsed with pure water. The removing capability to the sacrifice layer (dissolving capability) and the state of damages (corrosion) of the low dielectric layer were evaluated by observing with an SEM (scanning electron microscope). The results obtained are shown in Table 2 below.

The removing capability to the sacrifice layer (dissolving capability) and the state of damages (corrosion) of the low dielectric layer were evaluated with the following standards.
<Removing Capability to Sacrifice Layer (Dissolving Capability>
S: The sacrifice layer was completely removed (i.e., no residue remaining in the via holes was found).
A: A slight amount of a residue remained.
<State of Corrosion of Low Dielectric Layer>
S: No corrosion was found.
A: Slight corrosion (roughness) was found on the surface of the low dielectric layer.
B: Corrosion of the surface of the low dielectric layer was found.

TABLE 1

| | | Components of cleaning liquid (amount (mass %)) | | | | |
|---|---|---|---|---|---|---|
| | Component (a) | Component (b) | Component (c) | Component (d) | Component (e) | Other component |
| Example 1 | TMAH (10) | DMSO (50) | (40) | — | — | — |
| Example 2 | Choline (10) | DMSO (50) | (40) | — | — | — |
| Example 3 | TMAH (5), Choline (5) | DMSO (50) | (40) | — | — | — |
| Example 4 | Choline (10) | DMSO (49.5) | (40) | 1-thioglycerol (0.5) | — | — |

TABLE 1-continued

| | Components of cleaning liquid (amount (mass %)) | | | | | |
|---|---|---|---|---|---|---|
| | Component (a) | Component (b) | Component (c) | Component (d) | Component (e) | Other component |
| Example 5 | TMAH (10) | DMSO (49.5) | (40) | — | HDTMAH (0.5) | — |
| Comparative Example 1 | 0.1 mass % buffered hydrofluoric acid aqueous solution (100) | | | | | |
| Comparative Example 2 | TMAH (30) | DMSO (35) | (35) | — | — | — |
| Comparative Example 3 | TMAH (0.5) | DMSO (60) | (39.5) | — | — | — |
| Comparative Example 4 | TMAH (10) | DMSO (20) | (70) | — | — | — |
| Comparative Example 5 | TMAH (5) | DMSO (80) | (15) | — | — | — |

Note:
Components shown in Table 1 are as follows.
TMAH: tetramethylammonium hydroxide
Choline: (2-hydroxyethyl)trimethylammonium hydroxide
DMSO: dimethyl sulfoxide
HDTMAH: hexadecyltrimethylammonium hydroxide

TABLE 2

| | Removing capability to sacrifice layer | State of corrosion of low dielectric layer |
|---|---|---|
| Example 1 | S | S |
| Example 2 | S | S |
| Example 3 | S | S |
| Example 4 | S | S |
| Example 5 | S | S |
| Comparative Example 1 | S | B |
| Comparative Example 2 | S | B |
| Comparative Example 3 | A | S |
| Comparative Example 4 | S | B |
| Comparative Example 5 | A | S |

As described in detail above, according to the invention, a cleaning liquid can be obtained that attains in a well balanced manner such effects that a sacrifice layer used for forming a dual damascene structure is excellently removed, and a low dielectric layer is not damaged upon formation of a metallic wiring on a substrate having a metallic layer and the low dielectric layer formed thereon.

What is claimed is:

1. A cleaning liquid used in a process for forming a dual damascene structure comprising steps of etching a low dielectric layer accumulated on a substrate having thereon a metallic layer to form a first etched-space; charging a sacrifice layer in the first etched-space; partially etching the low dielectric layer and the sacrifice layer to form a second etched-space connected to the first etched-space; and removing the sacrifice layer remaining in the first etched-space with the cleaning liquid, wherein the cleaning liquid comprises (a) 1-25 mass % of a quaternary ammonium hydroxide represented by the following general formula (I), (b) 30-70 mass % of a water soluble organic solvent, (c) 20-60 mass % of water, and (d) a mercapto group-containing compound:

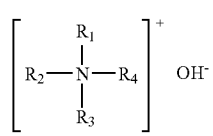

(I)

wherein $R_1$, $R_2$, $R_3$ and $R_4$ each independently represents an alkyl group having 1-4 carbon atoms or a hydroxyalkyl group having 1-4 carbon atoms.

2. The cleaning liquid as claimed in claim 1, wherein the sacrifice layer comprises a spin-on-glass material.

3. The cleaning liquid as claimed in claim 2, wherein the spin-on-glass material contains a light absorbing substance.

4. The cleaning liquid as claimed in claim 1, wherein component (a) is tetramethylammonium hydroxide and/or (2-hydroxyethyl)trimethylammonium hydroxide.

5. The cleaning liquid as claimed in claim 1, wherein component (b) is dimethyl sulfoxide.

6. The cleaning liquid as claimed in claim 1, wherein the cleaning liquid comprises 8-12 mass % of component (a), 40-60 mass % of component (b), and 30-50 mass % of component (c).

7. The cleaning liquid as claimed in claim 1, wherein the cleaning liquid further comprises (e) a quaternary ammonium hydroxide represented by the following general formula (II), with the proviso that component (e) differs from component (a):

(II)

wherein $R_5$, $R_6$, $R_7$ and $R_8$ each independently represents an alkyl group having 1-20 carbon atoms or a hydroxyalkyl group having 1-20 carbon atoms, provided that at least one of $R_5$, $R_6$, $R_7$ and $R_8$ represents an alkyl group having 10 or more carbon atoms, or at least two of $R_5$, $R_6$, $R_7$ and $R_8$ each independently represents a hydroxyalkyl group having 2-5 carbon atoms.

8. A process for treating a substrate having a dual damascene structure comprising steps of: etching a low dielectric layer accumulated on a substrate having thereon a metallic layer to form a first etched-space; charging a sacrifice layer in the first etched-space; partially etching the low dielectric layer and the sacrifice layer to form a second etched-space connected to the first etched-space; and bringing the sacrifice layer remaining in the first etched-space in contact with a cleaning liquid as claimed claim 1 to remove the sacrifice layer.

9. A process for treating a substrate having a dual damascene structure comprising steps of: etching a low dielectric layer accumulated on a substrate having thereon a metallic layer to form a first etched-space; charging a sacrifice layer in the first etched-space; partially etching the low dielectric layer and the sacrifice layer to form a second etched-space connected to the first etched-space; and bringing the sacrifice layer remaining in the first etched-space in contact with a cleaning liquid as claimed claim 8 to remove the sacrifice layer.

* * * * *